(12) United States Patent
Shimono

(10) Patent No.: US 9,543,294 B2
(45) Date of Patent: Jan. 10, 2017

(54) SEMICONDUCTOR DEVICE

(71) Applicant: Toyota Jidosha Kabushiki Kaisha, Toyota-shi Aichi-ken (JP)

(72) Inventor: Takaya Shimono, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/007,823

(22) Filed: Jan. 27, 2016

(65) Prior Publication Data

US 2016/0233214 A1    Aug. 11, 2016

(30) Foreign Application Priority Data

Feb. 9, 2015    (JP) ................. 2015-023206

(51) Int. Cl.
| | | |
|---|---|---|
| H01L 31/058 | (2006.01) | |
| H01L 27/06 | (2006.01) | |
| H01L 29/739 | (2006.01) | |
| H01L 23/36 | (2006.01) | |

(52) U.S. Cl.
CPC ....... *H01L 27/0664* (2013.01); *H01L 29/7397* (2013.01); *H01L 23/36* (2013.01)

(58) Field of Classification Search
CPC ... H01L 23/36; H01L 29/7397; H01L 27/0664
USPC ................................. 257/470, 140
See application file for complete search history.

(56) References Cited

U.S. PATENT DOCUMENTS

| | | | | |
|---|---|---|---|---|
| 7,462,922 | B2* | 12/2008 | Mori ................. | H01L 23/34 257/146 |
| 9,461,030 | B2* | 10/2016 | Nishimura ........ | H01L 29/66348 |
| 2011/0062545 | A1* | 3/2011 | Nakajima .......... | H01L 27/0255 257/470 |

FOREIGN PATENT DOCUMENTS

| | | |
|---|---|---|
| JP | H07-153920 A | 6/1995 |
| JP | H07-297392 A | 11/1995 |
| JP | 2002-314085 A | 10/2002 |
| JP | 2002-368222 A | 12/2002 |

* cited by examiner

*Primary Examiner* — Thien F Tran
(74) *Attorney, Agent, or Firm* — Dinsmore & Shohl LLP

(57) ABSTRACT

A semiconductor device includes a semiconductor substrate; and a temperature sense diode fixed on the semiconductor substrate. The temperature sense diode includes: an anode electrode; a p-type semiconductor layer being in contact with the anode electrode; an n-type semiconductor layer being in contact with the p-type semiconductor layer; and a cathode electrode being in contact with the n-type semiconductor layer; and the anode electrode. The p-type semiconductor layer, the n-type semiconductor layer, and the cathode electrode are stacked along a thickness direction of the semiconductor substrate. An electric resistivity of the anode electrode or the cathode electrode whichever is located closer to the semiconductor substrate is lower than an electric resistivity of the n-type semiconductor layer and an electric resistivity of the p-type semiconductor layer.

4 Claims, 5 Drawing Sheets

SEMICONDUCTOR DEVICE

CROSS-REFERENCE TO RELATED APPLICATION

This application claims priority to Japanese Patent Application No. 2015-023206 filed on Feb. 9, 2015, the entire contents of which are hereby incorporated by reference into the present application.

TECHNICAL FIELD

A technology disclosed herein relates to a semiconductor device.

DESCRIPTION OF RELATED ART

Japanese Patent Application Publication No. H07-153920 A discloses a semiconductor device including a semiconductor substrate and a temperature sense diode fixed on the semiconductor substrate. In the semiconductor substrate, a switching element is formed. The temperature sense diode includes a p-type semiconductor layer and an n-type semiconductor layer. The p-type semiconductor layer and the n-type semiconductor layer are adjacent to each other in a direction (hereinafter referred to as "planar direction") parallel to a surface of the semiconductor substrate. A forward voltage drop of the temperature sense diode changes due to temperature. Therefore, a temperature of the semiconductor substrate can be sensed by sensing the forward voltage drop of the temperature sense diode. In this semiconductor substrate, the switching element is controlled according to the forward voltage drop of the temperature sense diode. This makes it possible to control the switching element according to the temperature of the semiconductor substrate.

SUMMARY

A rise in the temperature of the semiconductor substrate causes the semiconductor substrate to thermally expand. This causes stress to be generated inside the temperature sense diode fixed on the semiconductor substrate. That is, stress is generated in the p-type semiconductor layer and the n-type semiconductor layer of the temperature sense diode. Such application of stress to the p-type semiconductor layer and the n-type semiconductor layer of the temperature sense diode causes changes in electric resistance of the p-type semiconductor layer and the n-type semiconductor layer due to the piezoresistance effect. In particular, an electric resistance in a direction along which the stress is applied more greatly changes than an electric resistance in a direction crossing the direction along which the stress is applied. Since the semiconductor substrate thermally expands mainly in the planar direction, the stress is applied to the p-type semiconductor layer and the n-type semiconductor layer mainly in the planar direction. Therefore, the electric resistances of the p-type semiconductor layer and the n-type semiconductor layer in the planar direction greatly change due to the piezoresistance effect.

As mentioned above, in the semiconductor device of Japanese Patent Application Publication No. H07-153920 A, the p-type semiconductor layer and the n-type semiconductor layer of the temperature sense diode are adjacent to each other in the planar direction of the semiconductor substrate. Therefore, a current flows through the temperature sense diode in the planar direction. That is, in the direction that the current flows through the temperature sense diode, the electric resistances of the p-type semiconductor layer and the n-type semiconductor layer greatly change due to the piezoresistance effect. Such a great change in electric resistance of the temperature sense diode due to the piezoresistance effect causes a deviation in correlation between the temperature and the forward voltage drop of the temperature sense diode. For this reason, the conventional temperature sense diode has low accuracy in sensing temperature. Therefore, the present disclosure provides a semiconductor device including a temperature sense diode capable of sensing a temperature of a semiconductor substrate with higher accuracy.

A semiconductor device disclosed herein comprises a semiconductor substrate; and a temperature sense diode fixed on the semiconductor substrate. The temperature sense diode comprises: an anode electrode; a p-type semiconductor layer being in contact with the anode electrode; an n-type semiconductor layer being in contact with the p-type semiconductor layer; and a cathode electrode being in contact with the n-type semiconductor layer. The anode electrode, the p-type semiconductor layer, the n-type semiconductor layer, and the cathode electrode are stacked along a thickness direction of the semiconductor substrate. An electric resistivity of the anode electrode or the cathode electrode whichever is located closer to the semiconductor substrate is lower than an electric resistivity of the n-type semiconductor layer and an electric resistivity of the p-type semiconductor layer.

In this semiconductor device, the anode electrode, p-type semiconductor layer, n-type semiconductor layer, and cathode electrode of the temperature sense diode are stacked along the thickness direction of the semiconductor substrate. Therefore, the direction that a current flows through the p-type semiconductor layer and the n-type semiconductor layer is substantially parallel to the thickness direction of the semiconductor substrate. Meanwhile, stress that is applied to the temperature sense diode due to thermal expansion of the semiconductor substrate is applied mainly in a planar direction. That is, in this semiconductor device, the direction that a current flows through the p-type semiconductor layer and the n-type semiconductor layer is substantially orthogonal to the direction of stress that is applied to the temperature sense diode due to thermal expansion of the semiconductor substrate. For this reason, the electric resistances of the p-type semiconductor layer and the n-type semiconductor layer are hardly influenced by the piezoresistance effect. That is, the electric resistances of the p-type semiconductor layer and the n-type semiconductor layer hardly change. Further, in the anode electrode or the cathode electrode whichever is located closer to the semiconductor substrate, the direction of flow of the current and the direction of stress are substantially parallel to each other, as the current needs to be supplied in the planar direction of the semiconductor substrate. Therefore, the resistance of the electrode changes due to the piezoresistance effect. However, even if the electric resistance of this electrode changes, the amount of change is extremely small, as the electric resistivity of this electrode is extremely low. Therefore, in this temperature sense diode, there hardly occurs a deviation in correlation between the temperature and the forward voltage drop. For this reason, this temperature sense diode can accurately sense the temperature of the semiconductor substrate.

DETAILED DESCRIPTION OF THE EMBODIMENTS

Figure 1:
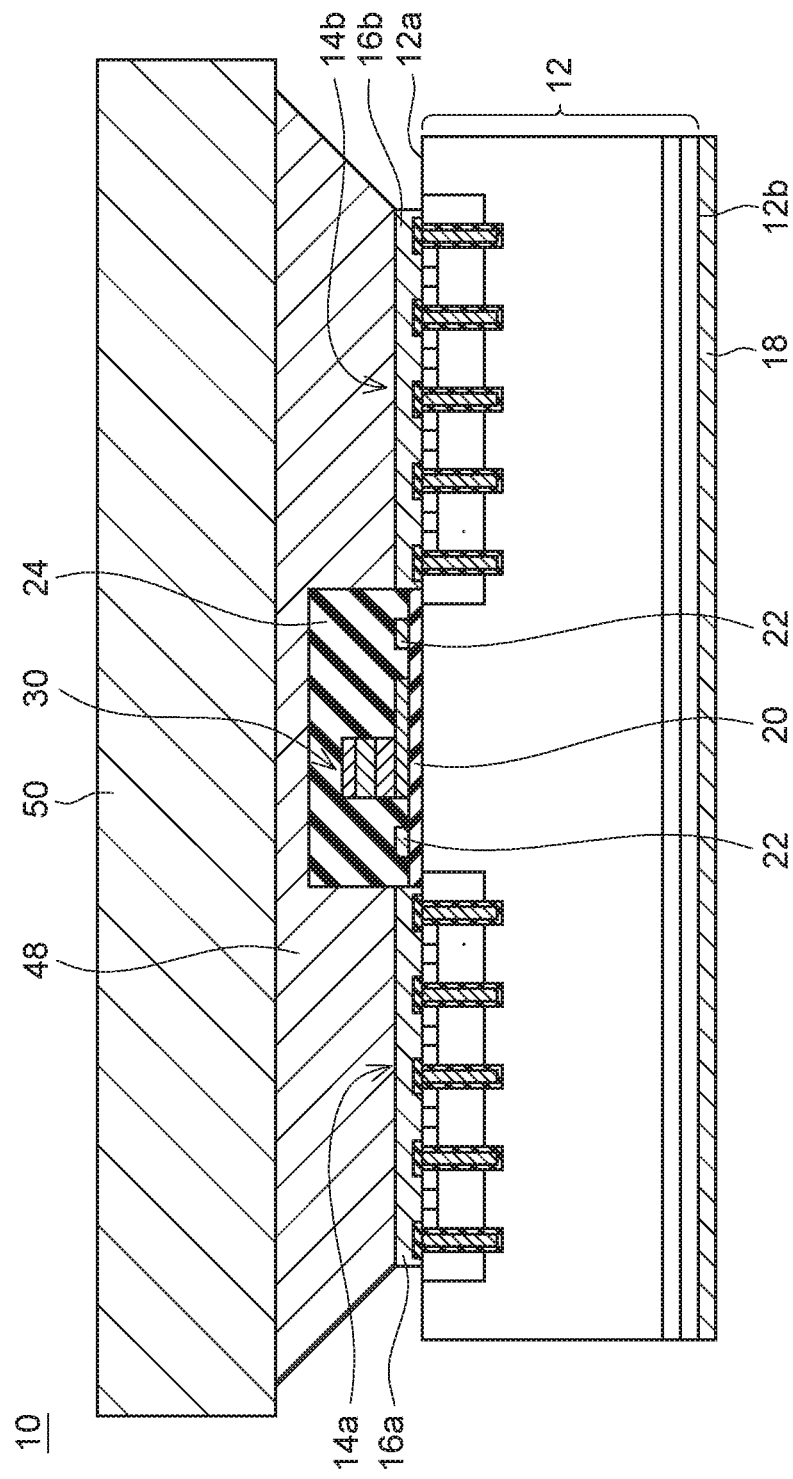
FIG. 1 is a longitudinal sectional view of a semiconductor device 10.

FIG. 1 shows a semiconductor device 10 according to an embodiment. The semiconductor device 10 includes a semiconductor substrate 12. The semiconductor substrate 12 includes an element region 14a and an element region 14b. In the element region 14a, an emitter electrode 16a is provided on an upper surface 12a of the semiconductor substrate 12. In the element region 14b, an emitter electrode 16b is provided on an upper surface 12a of the semiconductor substrate 12. The emitter electrode 16b may be linked to or separated from the emitter electrode 16a. A collector electrode 18 is provided on a lower surface 12b of the semiconductor substrate 12.

In both the element regions 14a and 14b, a plurality of trenches is provided in the upper surface 12a of the semiconductor substrate 12. In each of the trenches, a gate insulating film and a gate electrode are provided. In the both element regions 14a and 14b, n-type emitter regions, a p-type body region, an n-type drift region, a p-type collector region, and the like are provided inside the semiconductor substrate 12. IGBTs (Insulated Gate Bipolar Transistors) are formed by these regions, the gate insulating films, the gate electrodes, the emitter electrodes 16a and 16b, and the collector electrode 18 in the element regions 14a and 14b, respectively.

A portion of the upper surface 12a of the semiconductor substrate 12 located between the emitter electrodes 16a and 16b is covered with an insulating layer 20. On the insulating layer 20, gate wires 22 and a diode 30 are provided. The gate wires 22 are configured of n-type polysilicon. The gate wires 22 connect each gate electrode of the IGBTs to a gate pad (not illustrated). The diode 30 is a diode configured to sense a temperature of the semiconductor substrate 12. The diode 30 is fixed to the upper surface 12a of the semiconductor substrate 12 via the insulating layer 20. The diode 30 will be described in detail later.

On the insulating layer 20, an insulating layer 24 is provided. The insulating layer 24 covers the gate wires 22 and the diode 30. For clarification, FIG. 1 shows thicknesses of the diode 30 and the insulating layer 24 in an exaggerated manner.

Provided on top of the semiconductor substrate 12 are a solder layer 48 and a heatsink 50. The heatsink 50 is a metal plate. The heatsink 50 bridges over the emitter electrode 16a, the diode 30, and the emitter electrode 16b. The heatsink 50 is connected to the emitter electrodes 16a and 16b by the solder layer 48. That is, the heatsink 50 is connected to the upper surface 12a of the semiconductor substrate 12 via the solder layer 48 and the emitter electrodes 16a and 16b. The heatsink 50 is connected to the semiconductor substrate 12 at positions located on both sides of the diode 30. This causes the heatsink 50 to be fixed to the semiconductor substrate 12.

Figure 2:
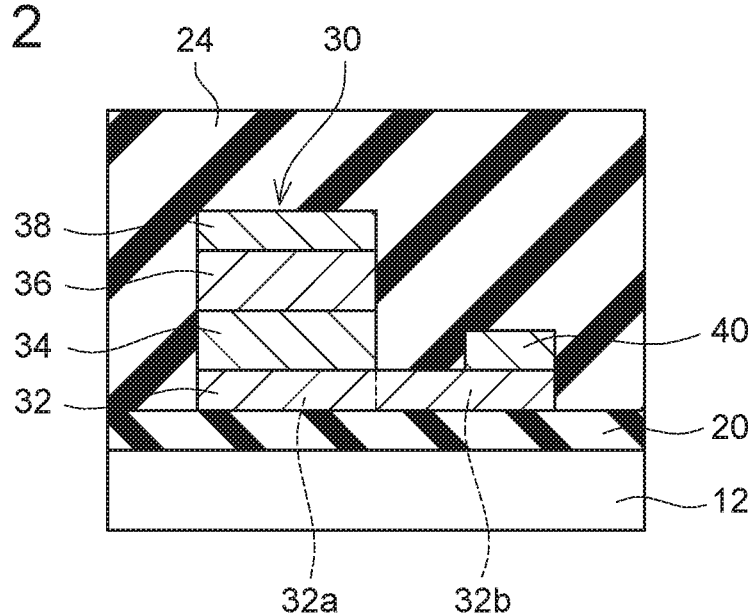
FIG. 2 is an enlarged cross-sectional view of a diode 30.

As shown in FIG. 2, the diode 30 includes a cathode electrode 32, an n-type semiconductor layer 34, a p-type semiconductor layer 36, an anode electrode 38, and a cathode wiring layer 40.

The cathode electrode 32 is provided on the insulating layer 20. The cathode electrode 32 is insulated from the semiconductor substrate 12 by the insulating layer 20. The cathode electrode 32 is configured of n-type polysilicon. The cathode electrode 32 includes a stacked portion 32a and an extension portion 32b. The stacked portion 32a is a portion on which the n-type semiconductor layer 34, the p-type semiconductor layer 36, and the anode electrode 38 are stacked, and the extension portion 32b is a portion extending outward from the stacked portion 32a along a planar direction of the semiconductor substrate 12.

The n-type semiconductor layer 34 is provided on the stacked portion 32a of the cathode electrode 32. The n-type semiconductor layer 34 is not provided on the extension portion 32b. The n-type semiconductor layer 34 is configured of n-type polysilicon. The n-type semiconductor layer 34 has a density of n-type impurities equal to or lower than a tenth of a density of n-type impurities in the cathode electrode 32 (that is, the cathode electrode 32 has a density of n-type impurities ten or more times higher than a density of n-type impurities in the n-type semiconductor layer 34). An electric resistivity of the n-type -polysilicon is inversely proportional to a density of n-type impurities in that polysilicon. For this reason, an electric resistivity of the n-type semiconductor layer 34 is ten or more times higher than an electric resistivity of the cathode electrode 32 (that is, the electric resistivity of the cathode electrode 32 is equal to or lower than a tenth of the electric resistivity of the n-type semiconductor layer 34). Thus, the electric resistivity of the cathode electrode 32 is lower than the electric resistivity of the n-type semiconductor layer 34.

The p-type semiconductor layer 36 is provided on the n-type semiconductor layer 34. The p-type semiconductor layer 36 is configured of p-type polysilicon. An electric resistivity of the p-type semiconductor layer 36 is ten or more times higher than the electric resistivity of the cathode electrode 32 (that is, the electric resistivity of the cathode electrode 32 is equal to or lower than a tenth of the electric resistivity of the p-type semiconductor layer 36). Thus, the electric resistivity of the cathode electrode 32 is lower than the electric resistivity of the p-type semiconductor layer 36.

The anode electrode 38 is provided on the p-type semiconductor layer 36. The anode electrode 38 is configured of metal (e.g. AlSi). An electric resistivity of the anode electrode 38 is equal to or lower than a tenth of the electric resistivity of the n-type semiconductor layer 34, and is equal to or lower than a tenth of the electric resistivity of the p-type semiconductor layer 36. The anode electrode 38 is connected to an external device at an unillustrated position.

As described above, the diode 30 has a stacked structure in which the stacked portion 32a of the cathode electrode 32, the n-type semiconductor layer 34, the p-type semiconductor layer 36, and the anode electrode 38 are stacked along a thickness direction of the semiconductor substrate 12.

The cathode wiring layer 40 is provided on the extension portion 32b of the cathode electrode 32. The cathode wiring layer 40 is configured of metal (e.g. AlSi). The cathode wiring layer 40 is connected to an external device at an unillustrated position.

Figure 3:
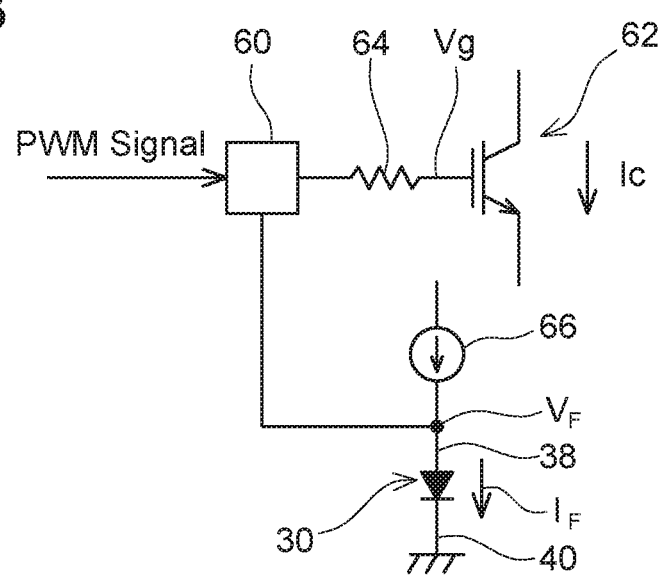
FIG. 3 is a circuit diagram of the semiconductor device 10.

FIG. 3 is a circuit diagram of the semiconductor device 10. The circuit shown in FIG. 3 is a circuit configured to drive an IGBT 62 of the semiconductor substrate 12. Although a plurality of IGBTs is formed inside the semiconductor substrate 12, these IGBTs operate substantially as a single element, as they are controlled in accordance with a common gate signal. Therefore, in FIG. 3, the plurality of IGBTs inside the semiconductor substrate 12 is shown as the single IGBT 62. The IGBT 62 has its collector connected to a high potential and its emitter connected to a low potential. A collector current Ic (i.e. a current that flows from the collector to the emitter) of the IGBT 62 is supplied to a motor (not illustrated). The IGBT 62 controls the current that is supplied to the motor.

The cathode wiring layer 40 of the diode 30 is connected to the ground. A constant-current power supply 66 is connected to the anode electrode 38 of the diode 30. The constant-current power supply 66 supplies a constant reference current $I_F$ (in the present embodiment, a current of approximately 200 µA) to the diode 30 in a forward direction. Therefore, a forward voltage drop $V_F$ (i.e. an anode-cathode potential difference of the diode 30) during flow of the reference current $I_F$ through the diode 30 in the forward direction is outputted to the anode electrode 38 of the diode 30.

The IGBT 62 has its gate connected to a gate controller circuit 60 via a gate resistor 64. Further, the gate controller circuit 60 is connected to the anode electrode 38 of the diode 30. The forward voltage drop $V_F$ is inputted to the gate controller circuit 60. Further, a PWM signal is inputted to the gate controller circuit 60 from an external device. The PWM signal is a signal of a pulse waveform. A duty ratio (i.e. a ratio of a high-potential period) of the PWM signal is changed according to an operating state of the motor. The gate controller circuit 60 controls a gate potential Vg of the IGBT 62 in accordance with the PWM signal and the forward voltage drop $V_F$. By so doing, the gate controller circuit 60 controls the collector current Ic of the IGBT 62.

The following describes how the semiconductor device 10 operates. The forward voltage drop $V_F$ of the diode 30 is highly correlated with a temperature of the diode 30. The higher the temperature of the diode 30 becomes, the lower the forward voltage drop $V_F$ becomes. Since the diode 30 is fixed to the surface of the semiconductor substrate 12, the temperature of the diode 30 is substantially the same as the temperature of the semiconductor substrate 12. Therefore, the forward voltage drop $V_F$ of the diode 30 can be utilized as an index that indicates the temperature of the semiconductor substrate 12.

Figure 4:
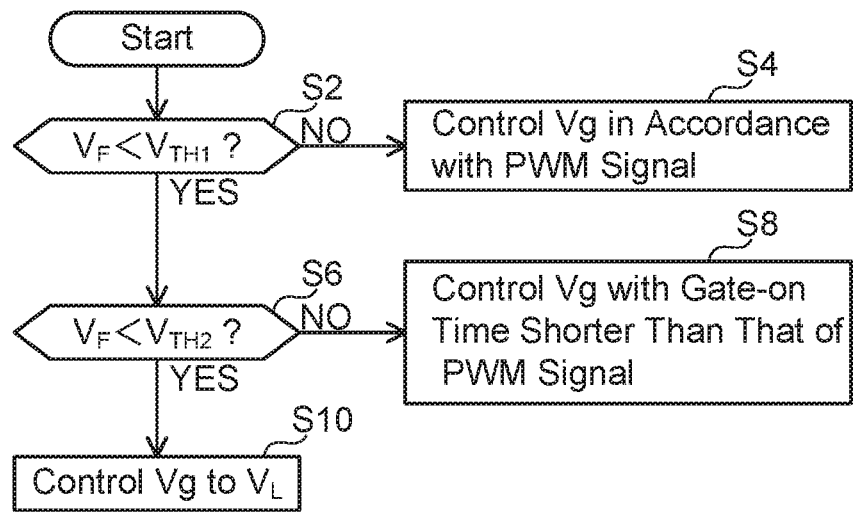
FIG. 4 is a flow chart of processes that a gate controller circuit 60 executes.
Figure 5:
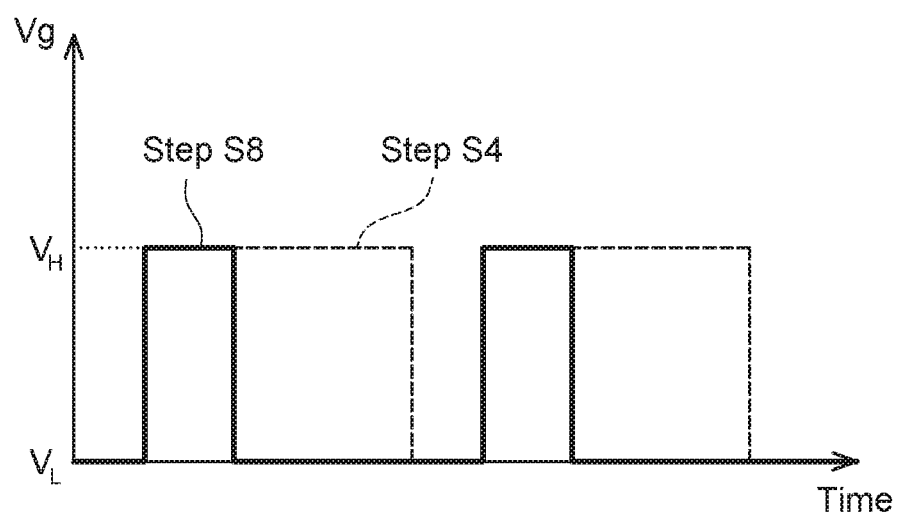
FIG. 5 is a graph showing changes in gate potential Vg according to an embodiment.

While the semiconductor device 10 is operating, the gate controller circuit 60 repeatedly executes processes shown in FIG. 4. In step S2, the gate controller circuit 60 determines whether the forward voltage drop $V_F$ of the diode 30 is lower than a threshold value $V_{TH1}$. That is, the gate controller circuit 60 determines whether the temperature of the semiconductor substrate 12 is higher than a first reference temperature corresponding to the threshold value $V_{TH1}$. If NO is determined in step S2 (i.e. if the gate controller circuit 60 determines in step S2 that $V_F \geq V_{TH1}$), the gate controller circuit 60 executes step S4. That is, if the temperature of the semiconductor substrate 12 is equal to or lower than the first reference temperature, the gate controller circuit 60 executes step S4. In step S4, the gate controller circuit 60 controls the gate potential Vg in accordance with the PWM signal. FIG. 5 shows an example of the gate potential Vg that is controlled by the gate controller circuit 60. In FIG. 5, the potential $V_L$ is a low potential (gate-off potential) that causes the IGBT 62 to be turned off, and the potential $V_H$ is a high potential (gate-on potential) that causes the IGBT 62 to be turned on. During a period of application of the gate-off potential $V_L$, the IGBT 62 is off, and during a period of application of the gate-on potential $V_H$, the IGBT 62 is on. A duty ratio of the gate potential Vg is calculated according to $T_H/(T_H+T_L)$, where the time $T_L$ is a length of a period of the gate-off potential $V_L$ and the time $T_H$ is a length of a period of the gate-on potential $V_H$. In step S4, the gate controller circuit 60 controls the gate potential Vg so that the duty ratio of the gate potential Vg becomes equal to that of the PWM signal inputted.

If YES is determined in step S2 (i.e. if the gate controller circuit 60 determines in step S2 that $V_F < V_{TH1}$), the gate controller circuit 60 executes step S6. In step S6, the gate controller circuit 60 determines whether the forward voltage drop $V_F$ of the diode 30 is lower than a threshold value $V_{TH2}$. It should be noted that the threshold value $V_{TH2}$ is lower than the threshold value $V_{TH1}$. That is, the gate controller circuit 60 determines whether the temperature of the semiconductor substrate 12 is higher than a second reference temperature corresponding to the threshold value $V_{TH2}$. Since the threshold value $V_{TH2}$ is lower than the threshold value $V_{TH1}$, the second reference temperature is higher than the first reference temperature. If NO is determined in step S6 (i.e. if the gate controller circuit 60 determines in step S6 that $V_F \geq V_{TH2}$), the gate controller circuit 60 executes step S8. That is, if the temperature of the semiconductor substrate 12 is higher than the first reference temperature but is equal to or lower than the second reference temperature, the gate controller circuit 60 executes step S8. In other words, if the temperature of the semiconductor substrate 12 is high to some extent but is a temperature at which the IGBT 62 can operate, the gate controller circuit 60 executes step S8. In step S8, the gate controller circuit 60 controls the gate potential Vg so that the duty ratio (i.e. the ratio of gate-on time) of the gate potential Vg becomes lower than that of the PWM signal. For example, even if the duty ratio of the PWM signal in step S8 is equal to that in step S4, the duty ratio of the gate potential Vg in step S8 is lower than that in step S4 as shown in FIG. 5. There is no difference in magnitude of the gate-on potential $V_H$ between step S4 and step S8. Thus, in step S8, the duty ratio becomes lower, and the collector current Ic (or, more specifically, an average value of the collector current Ic) of the IGBT 62 becomes lower accordingly. That is, in step S8, as compared with step S4, the IGBT 62 is controlled so that a low collector current Ic flows. This suppresses a rise in the temperature of the semiconductor substrate 12.

If YES is determined in step S6 (i.e. if the gate controller circuit 60 determines in step S6 that $V_F < V_{TH2}$), the gate controller circuit 60 executes step S10. That is, if the temperature of the semiconductor substrate 12 is so high that the IGBT 62 cannot continue to operate, the gate controller circuit 60 executes step S10. In step S10, the gate controller circuit 60 controls the gate potential Vg so that the gate potential Vg becomes equal to the gate-off potential $V_L$. That is, regardless of the PWM signal, the gate controller circuit 60 causes the IGBT 62 to be off throughout a period during which the gate potential Vg is controlled. This prevents the IGBT 62 from malfunctioning due to high temperature.

Thus, in this semiconductor device 10, the operation of the IGBT 62 is changed according to the forward voltage drop $V_F$ of the diode 30 (i.e. the temperature of the semiconductor substrate 12). This allows the IGBT 62 to operate appropriately according to temperature.

Figure 6:
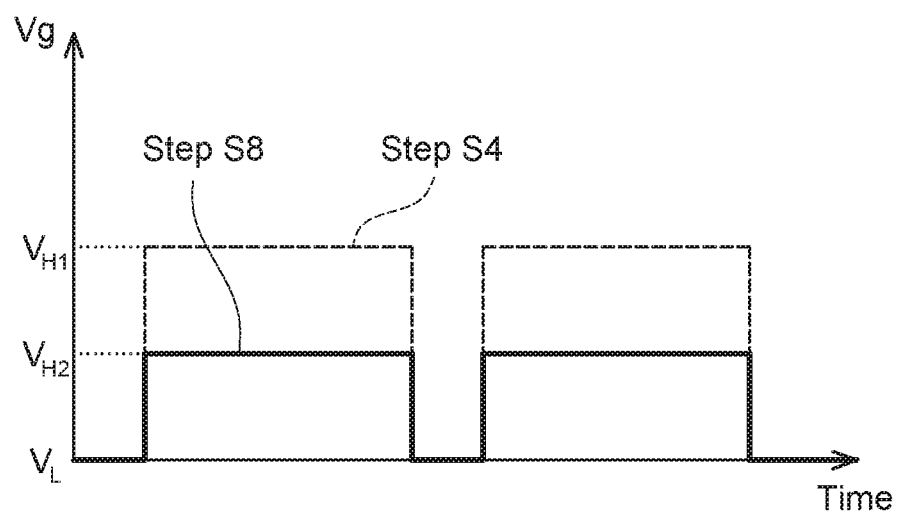
FIG. 6 is a graph showing changes in gate potential Vg according to a modification.

In step S8, a control that lowers the gate-on potential $V_H$ as shown in FIG. 6 may be executed instead of the control that lowers the duty ratio as shown in FIG. 5. That is, the control method shown in FIG. 6 includes controlling the gate potential Vg at the same duty ratio as that of the PWM signal in step S8, as in step S4. However, the control method shown in FIG. 6 includes controlling the gate potential Vg so that the gate-on potential $V_{H2}$ in step S8 is lower than the gate-on potential $V_{H1}$ in step S4. This causes the collector current Ic in step S8 to be lower than the collector current Ic in step S4. As with the control method shown in FIG. 5, the control method shown in FIG. 6 allows the IGBT 62 to operate while suppressing a rise in the temperature of the semiconductor substrate 12.

Further, in the foregoing description, the gate controller circuit 60 executes step S4, S8, or S10 according to temperature. Alternatively, the gate controller circuit 60 may be configured to execute either step S4 or step S8 according to temperature. Alternatively, the gate controller circuit 60 may be configured to execute either step S4 or step S10 according to temperature.

Next, the piezoresistance effect of the diode 30 will be described. A rise in the temperature of the semiconductor substrate 12 causes the semiconductor substrate 12 to thermally expand. The thermal expansion of the semiconductor substrate 12 causes stress to be applied to the diode 30. Further, heat generated in the semiconductor substrate 12 is transferred to the heatsink 50 through the solder layer 48. This causes the heatsink 50, too, to thermally expand. Since a linear expansion coefficient of the heatsink 50 and a linear expansion coefficient of the semiconductor substrate 12 are different from each other, stress attributed to the difference in linear expansion coefficient is generated between the heatsink 50 and the semiconductor substrate 12. Since heatsink 50 is connected to the semiconductor substrate 12 on both sides of the diode 30, the stress attributed to the difference in coefficient of linear expansion is applied to the diode 30, too. This stress acts mainly in the planar direction of the semiconductor substrate 12 (i.e. in a direction parallel to the upper surface 12a of the semiconductor substrate 12). Therefore, the stress acts in the planar direction also on each of the layers (i.e. the anode electrode 38, the p-type semiconductor layer 36, the n-type semiconductor layer 34, and the cathode electrode 32) forming the diode 30. When the stress acts in this manner, the piezoresistance effect causes a change in electric resistance of each of the layers. The change in electric resistance of each of the layers of the diode 30 due to the stress leads to a change in the forward voltage drop $V_F$ of the diode 30, and the change in the forward voltage drop $V_F$ of the diode 30 in turn causes a deviation in correlation between the forward voltage drop $V_F$ of the diode 30 and the temperature of the semiconductor substrate 12. However, in the semiconductor device 10 according to the present embodiment, as will be described in detail later, the influence of the piezoresistance effect can be kept to the minimum.

Figure 7:
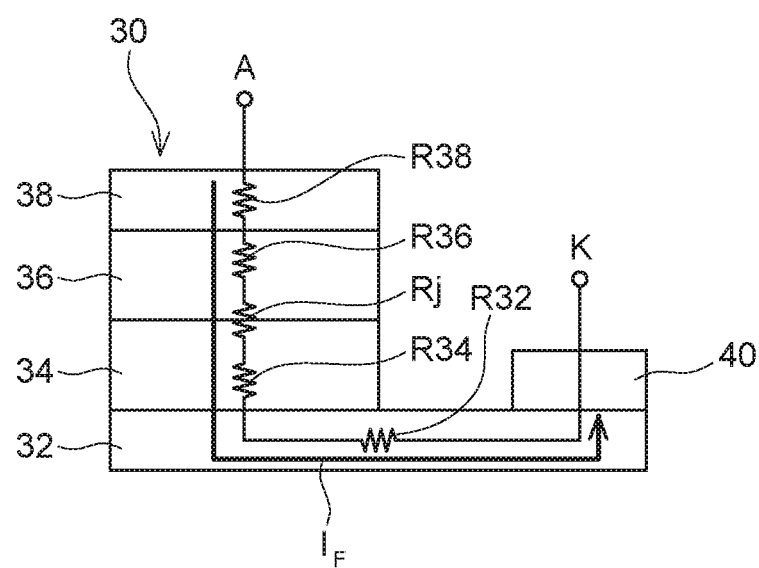
FIG. 7 is a diagram showing an internal circuit of the diode 30.

FIG. 7 shows a path of the reference current $I_F$ flowing through the diode 30. As indicated by an arrow in FIG. 7, the reference current $I_F$ flows from the anode electrode 38 toward the cathode wiring layer 40. In the anode electrode 38, the p-type semiconductor layer 36, and the n-type semiconductor layer 34, the reference current $I_F$ flows mainly along a stacking direction (i.e. the thickness direction of the semiconductor substrate 12). In the cathode electrode 32, the reference current $I_F$ flows mainly along a transverse direction (i.e. the planar direction of the semiconductor substrate 12). In FIG. 7, reference signs R38, R36, R34, and R32 represent resistors of the anode electrode 38, the p-type semiconductor layer 36, the n-type semiconductor layer 34, and the cathode electrode 32, respectively. Further, in FIG. 7, reference sign Rj represents a barrier at a p-n junction on an interface between the p-type semiconductor layer 36 and the n-type semiconductor layer 34. The forward voltage drop $V_F$ is a value obtained by adding all voltages that are applied to the resistors R32, R34, R36, and R38 and the barrier Rj during conduction of the reference current $I_F$.

The barrier Rj is hardly influenced by the piezoresistance effect. That is, the barrier Rj hardly changes due to stress. The electric resistances R32, R34, R36, and R38 change according to the influence of the piezoresistance effect. Therefore, by minimizing amounts of change in the electric resistances R32, R34, R36, and R38 due to the piezoresistance effect, deterioration in the correlation between the forward voltage drop $V_F$ of the diode 30 and the temperature of the semiconductor substrate 12 can be prevented.

Since the electric resistivity of the anode electrode 38 is equal to or lower than a tenth of the electric resistivity of the p-type semiconductor layer 36 and a tenth of the electric resistivity of the n-type semiconductor layer 34, the electric resistance R38 of the anode electrode 38 is extremely low. Further, the reference current $I_F$ flows through the anode electrode 38 mainly in the thickness direction. In the anode electrode 38, the direction of flow of the reference current $I_F$ and the direction of stress are substantially orthogonal to each other. The piezoresistance effect remarkably influences an electric resistance in a direction parallel to stress, but hardly influences an electric resistance in a direction orthogonal to stress. For this reason, the electric resistance R38 of the anode electrode 38 hardly changes due to the piezoresistance effect. Thus, the electric resistance R38 of the anode electrode 38 per se is low, and the electric resistance R38 of the anode electrode 38 hardly changes due to the piezoresistance effect. For this reason, the amount of change in the electric resistance R38 due to the piezoresistance effect is extremely small.

The reference current $I_F$ flows through the p-type semiconductor layer 36 mainly in the thickness direction. In the p-type semiconductor layer 36, the direction of flow of the reference current $I_F$ and the direction of stress are substantially orthogonal to each other. For this reason, the electric resistance R36 of the p-type semiconductor layer 36 hardly changes due to the piezoresistance effect. Therefore, the amount of change in the electric resistance R36 due to the piezoresistance effect is extremely small.

The reference current $I_F$ flows through the n-type semiconductor layer 34 mainly in the thickness direction. In the n-type semiconductor layer 34, the direction of flow of the reference current $I_F$ and the direction of stress are substantially orthogonal to each other. For this reason, the electric resistance R34 of the n-type semiconductor layer 34 hardly changes due to the piezoresistance effect. Therefore, the amount of change in the electric resistance R34 due to the piezoresistance effect is extremely small.

The reference current $I_F$ flows through the cathode electrode 32 mainly in the planar direction. For this reason, in the cathode electrode 32, the direction of flow of the reference current $I_F$ and the direction of stress are substantially parallel to each other. For this reason, the electric resistance R32 of the cathode electrode 32 easily changes due to the piezoresistance effect. However, the electric resistivity of the cathode electrode 32 is equal to or lower than a tenth of the electric resistivity of the p-type semiconductor layer 36 and a tenth of the electric resistivity of the n-type semiconductor layer 34. For this reason, the electric resistance R32 of the cathode electrode 32 is extremely low. More particularly, the electric resistance R32 is equal to or lower than a tenth of the electric resistance R34 and a tenth of the electric resistance R36. Thus, the electric resistance R32 of the cathode electrode 32 is sufficiently lower than the electric resistances R34 and R36. Therefore, even if the electric resistance R32 changes due to the piezoresistance effect, an amount of change in the forward voltage drop $V_F$ is extremely small.

Since the amounts of change in the electric resistances R32, R34, R36, and R38 due to the piezoresistance effect are thus small, the forward voltage drop $V_F$ hardly changes due to the piezoresistance effect. Therefore, in the semiconductor device 10, even application of stress to the diode 30 hardly causes a deviation in the correlation between the forward voltage drop $V_F$ and the temperature. Therefore, use of the diode 30 makes it possible to control the IGBT 62 accurately depending on the temperature of the semiconductor substrate 12.

Next, a method for manufacturing the semiconductor device 10 is described. First, the insulating layer 20 is formed on a portion of the semiconductor substrate 12. Next, the cathode electrode 32 and the gate wires 22 are formed on the insulating layer 20. The cathode electrode 32 and the gate wires 22 are both formed with n-type polysilicon. The cathode electrode 32 and the gate wires 22 can be simultaneously formed by CVD. Next, the n-type semiconductor layer 34 (which is an n-type polysilicon layer) and the p-type semiconductor layer 36 (which is a p-type polysilicon layer) are formed in sequence by CVD. It should be noted that the n-type semiconductor layer 34 and the p-type semiconductor layer 36 may each be formed by implanting n-type or p-type impurities into a polysilicon layer formed by CVD. Next, the structure on an upper surface 12$a$ side of the IGBT 62 (i.e. the emitter region, the body region, the trenches, the gate insulating films, and the gate electrodes) is formed in the semiconductor substrate 12. It should be noted that the gate electrodes are formed by polysilicon. Further, the emitter region and the body region are formed by implanting ions into the semiconductor substrate 12. In activating the ions implanted in the semiconductor substrate 12, the semiconductor substrate 12 is heat-treated. At this occasion, if a metal layer is formed on the surface of the semiconductor substrate 12, the metal may diffuse into the semiconductor substrate 12 and thus may make it impossible to control the characteristics of the semiconductor substrate 12 as intended. Further, a furnace for use in heat treatment may be contaminated by the metal. Contrary to this, in this manufacturing method, no metal layer is present on the surface of the semiconductor substrate 12 at the time of heat treatment, as the cathode electrode 32 is configured of n-type polysilicon. This makes it possible to prevent metal from diffusing into the semiconductor substrate 12 and prevent the furnace from being contaminated by metal. Once the structure on the upper surface 12$a$ side of the IGBT 62 is completed, the emitter electrodes 16$a$ and 16$b$, the anode electrode 38, and the cathode wiring layer 40 are formed with metal. Next, the insulating layer 24 is formed. Next, the structure on a lower surface 12$b$ side of the IGBT 62 (i.e. the collector region, the collector electrode 18, etc.) is formed. Thereafter, for example by connecting the heatsink 50 to the emitter electrodes 16$a$ and 16$b$, the semiconductor device 10 is completed.

As described above, the cathode electrode 32, which is the layer in the stacked structure of the diode 30 that is closest to the semiconductor substrate 12, is configured of an n-type polysilicon layer. For this reason, even if heat treatment is performed after the formation of the cathode electrode 32, the semiconductor substrate 12 and the furnace are not contaminated by metal. Therefore, by forming the metal electrodes (i.e. the emitter electrodes 16$a$ and 16$b$, the anode electrode 38, etc.) after the heat treatment, contamination of the semiconductor substrate 12 and the furnace by metal can be prevented. Further, since carriers in the cathode electrode 32 (which is an n-type polysilicon layer) are electrons, the electric resistivity (i.e. the electric resistance R32) of the cathode electrode 32 can be easily lowered. Therefore, the amount of change in the electric resistance R32 of the cathode electrode 32 due to the piezoresistance effect can be made smaller, and accordingly a change in the forward voltage drop $V_F$ due to the piezoresistance effect can be suppressed. It should be noted that in a case where metal contamination is not a problem, the cathode electrode 32 may be configured of metal.

In a semiconductor device 10 according to a modification, the layers of the diode 30 may be stacked in an order opposite to the order in which they are stacked in the aforementioned embodiment. That is, beginning from the semiconductor substrate 12 side, the anode electrode 38, the p-type semiconductor layer 36, the n-type semiconductor layer 34, and the cathode electrode 32 may be stacked in this order. Even such a configuration can better suppress the influence of the piezoresistance effect than the conventional diode. In this case, however, it is necessary to provide the anode electrode 38 with an extension portion by making the anode electrode 38 wider than the other layers. This causes the reference current $I_F$ to flow through the extension portion of the anode electrode 38 in the planar direction. Further, in this configuration, it is preferable that the anode electrode 38 is formed by polysilicon having a high density of p-type impurities in order to prevent the metal contamination at the time of heat treatment in the manufacturing process. In this case, the electric resistance of the anode electrode 38 is higher than the electric resistance R32 of the cathode electrode 32 in the aforementioned embodiment, as carriers in the p-type polysilicon are holes. For this reason, in the semiconductor device according to the modification, the anode electrode 38 is influenced by the piezoresistance effect, and the forward voltage drop $V_F$ more easily changes due to the piezoresistance effect than in the aforementioned embodiment. Therefore, the aforementioned embodiment can more effectively suppress the influence of the piezoresistance effect than the semiconductor device according to the modification.

In the aforementioned embodiment, the IGBTs are formed in the semiconductor substrate 12. Alternatively, the IGBTs may be replaced by other switching elements (e.g. MOSFETs) formed in the semiconductor substrate 12. Alternatively, the IGBTs may be replaced by elements other than switching elements formed in the semiconductor substrate 12.

Some of the following enumerates technical elements disclosed herein. It should be noted that the following technical elements are each independently useful.

A semiconductor device disclosed in the present disclosure as an example may further comprise a heatsink connected to the semiconductor substrate at positions located on both sides of the temperature sense diode.

When the heatsink is connected to the semiconductor substrate in this manner, the difference in amount of thermal expansion between the heatsink and the semiconductor substrate causes higher stress to be applied to the temperature sense diode. In such a structure in which stress is easily applied to the temperature sense diode, the influence of the piezoresistance effect can be more effectively suppressed by employing a stacked structure in which the anode electrode, the p-type semiconductor layer, the n-type semiconductor layer, and the cathode electrode are stacked along the thickness direction of the semiconductor substrate.

In a semiconductor device disclosed in the present disclosure as an example, the semiconductor substrate may comprise a switching element. Further, the semiconductor device may further comprise: a power source configured to supply a reference current to the temperature sense diode in a forward direction, and a controller circuit configured to, when a forward voltage drop of the temperature sense diode during flow of the reference current through the temperature sense diode is lower than a threshold value, control a current flowing through the switching element to be smaller than the a current flowing through the switching element of when the forward voltage drop is equal to or more higher than the threshold value.

In a semiconductor device disclosed in the present disclosure as an example, a cathode electrode may be configured of an n-type semiconductor having a density of n-type impurities equal to or more than ten times larger than a density of n-type impurities in the n-type semiconductor layer. The cathode electrode may include a stacked portion and an extension portion, the stacked portion being a portion on which the n-type semiconductor layer, the p-type semiconductor layer and the anode electrode are stacked, and the extension portion being a portion extending outward from the stacked portion. The semiconductor device may further comprise a wiring layer located on the extension portion.

In this semiconductor device, a current flowing through the extension portion flows in the planar direction of the semiconductor substrate. However, the electric resistivity of the extension portion (i.e. the cathode electrode) is low (that is, the electric resistance of the extension portion is low). Therefore, even if the electric resistance of the extension portion changes due to the piezoresistance effect, the influence on the forward voltage drop of the diode is extremely small. Further, when the cathode electrode located closest to the semiconductor substrate in the temperature sense diode is configured of an n-type semiconductor, contamination of the semiconductor substrate by metal can be suppressed.

Specific examples of the present disclosure have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device, comprising:
    a semiconductor substrate; and
    a temperature sense diode fixed on the semiconductor substrate,
    wherein
    the temperature sense diode comprises:
    an anode electrode;
    a p-type semiconductor layer being in contact with the anode electrode;
    an n-type semiconductor layer being in contact with the p-type semiconductor layer; and
    a cathode electrode being in contact with the n-type semiconductor layer; and
    the anode electrode, the p-type semiconductor layer, the n-type semiconductor layer, and the cathode electrode are stacked along a thickness direction of the semiconductor substrate, and
    an electric resistivity of the anode electrode or the cathode electrode whichever is located closer to the semiconductor substrate is lower than an electric resistivity of the n-type semiconductor layer and an electric resistivity of the p-type semiconductor layer.

2. The semiconductor device of claim 1, further comprising a heatsink connected to the semiconductor substrate at positions located on both sides of the temperature sense diode.

3. The semiconductor device of claim 1, wherein
    the semiconductor substrate comprises a switching element,
    the semiconductor device further comprises:
    a power source configured to supply a reference current to the temperature sense diode in a forward direction, and
    a controller circuit configured to, when a forward voltage drop of the temperature sense diode during flow of the reference current through the temperature sense diode is lower than a threshold value, control a current flowing through the switching element to be smaller than the current flowing through the switching element when the forward voltage drop is equal to or higher than the threshold value.

4. The semiconductor device of claim 1, wherein
    the cathode electrode is configured of an n-type semiconductor having a density of n-type impurities ten or more times higher than a density of n-type impurities in the n-type semiconductor layer,
    the cathode electrode includes a stacked portion and an extension portion, the stacked portion being a portion on which the n-type semiconductor layer, the p-type semiconductor layer and the anode electrode are stacked, and the extension portion being a portion extending outward from the stacked portion, and
    the semiconductor device further comprises a wiring layer located on the extension portion.

* * * * *